United States Patent [19]

Rishworth et al.

[11] Patent Number: 4,755,146

[45] Date of Patent: Jul. 5, 1988

[54] HEAT-DISSIPATING SOCKET CONNECTOR FOR LEADED MODULES

[75] Inventors: Paul L. Rishworth, Chicago; Alan S. Walse, LeGrange, both of Ill.

[73] Assignee: Molex Incorporated, Lisle, Ill.

[21] Appl. No.: 58,068

[22] Filed: Jun. 4, 1987

[51] Int. Cl.⁴ .................................. H01R 23/72
[52] U.S. Cl. .................................. 439/71; 361/383; 439/923
[58] Field of Search ........................ 439/55, 59–62, 439/68–73, 525, 526, 485, 923; 174/52 FP; 361/380–384, 388, 389, 393, 403–407

[56] References Cited

U.S. PATENT DOCUMENTS

| | | | |
|---|---|---|---|
| 3,697,815 | 10/1972 | Grant | 361/384 |
| 4,222,622 | 9/1980 | Griffin et al. | 439/71 |
| 4,558,397 | 12/1985 | Olsson | 361/404 |

*Primary Examiner*—Neil Abrams
*Attorney, Agent, or Firm*—John W. Cornell; Louis A. Hecht

[57] ABSTRACT

A new and improved heat-dissipating socket connector for connecting individual leads of a leaded module to individual circuits on a printed circuit board comprises a unitary molded dielectric frame including a module-receiving recess. The frame is cantedly mounted on the circuit board with the recess disposed at an angle with respect to the printed board surface. Compliant terminals are mounted in generally open terminal receiving cavities within the frame which are adapted to engage side portions of leads on an inserted module with high contact pressure in an anti-overstress manner. Openings within the frame together with an exposed terminal mounting arrangement, provide ventilation and airflow exposure for portions of the connector and module susceptible to the generation of high temperatures in use. The overall arrangement provides enhanced electrical reliability by reducing the possibilty of heat induced failures. The new and improved socket connector does not require increased board surface area and provides for full visual inspection for solder connections between connector terminals and printed circuits.

19 Claims, 3 Drawing Sheets

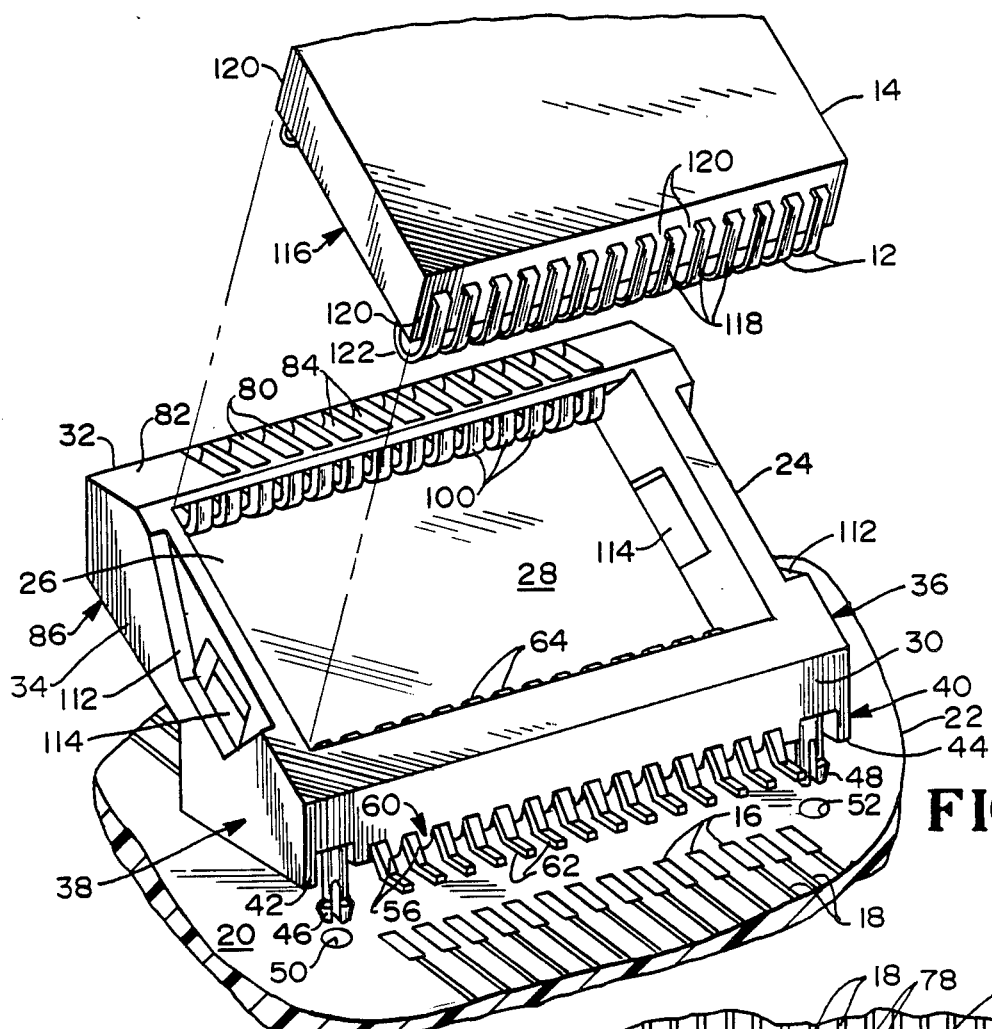
FIG.1
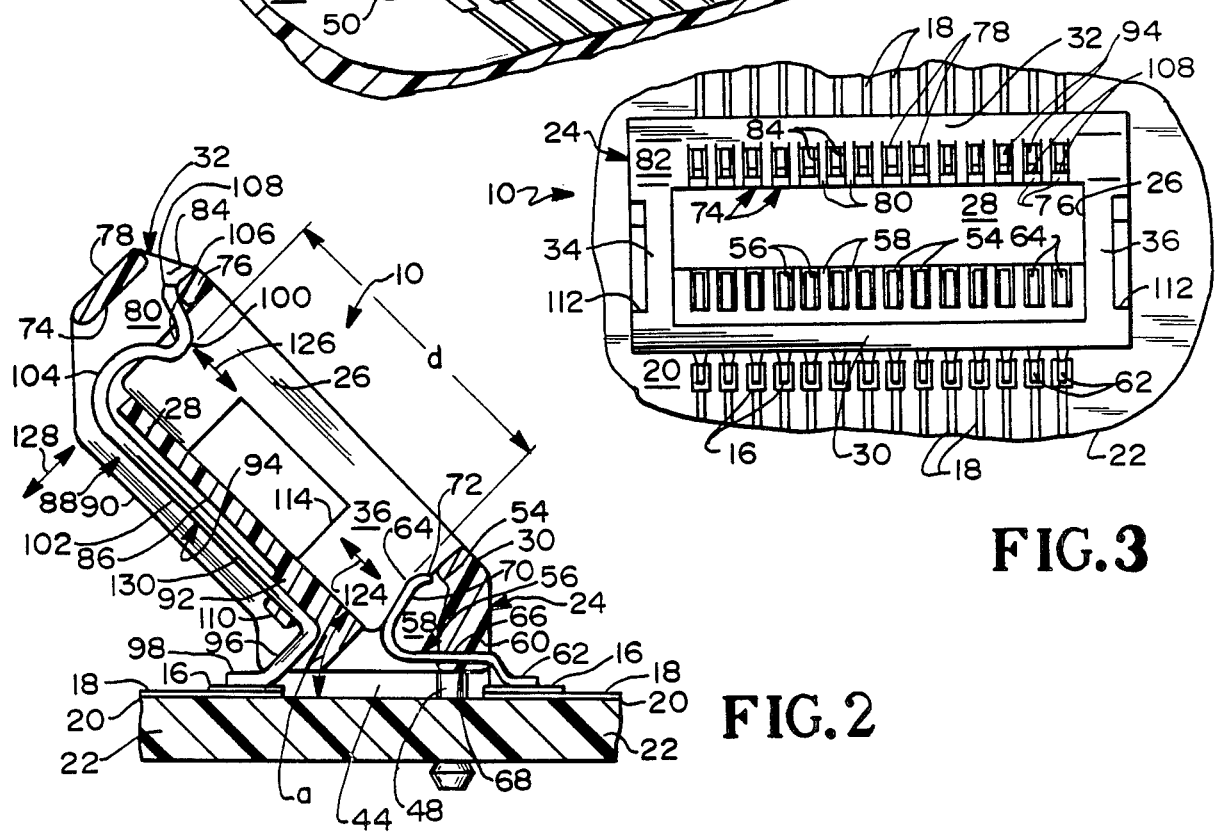
FIG.2
FIG.3

U.S. Patent  Jul. 5, 1988  Sheet 2 of 3  4,755,146
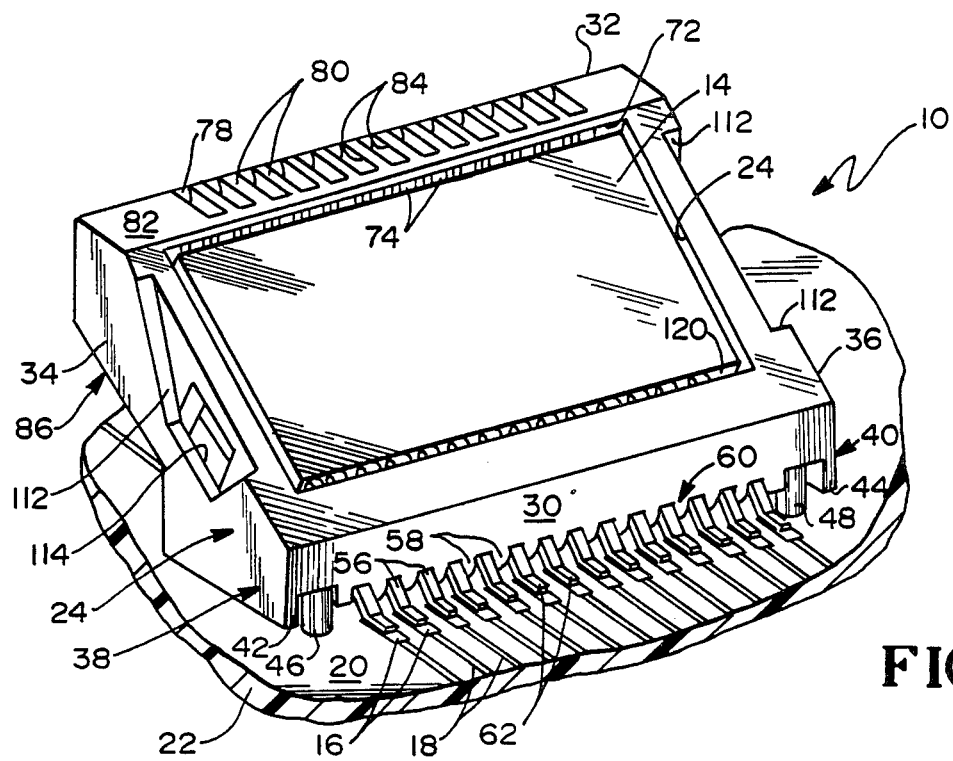
FIG.6
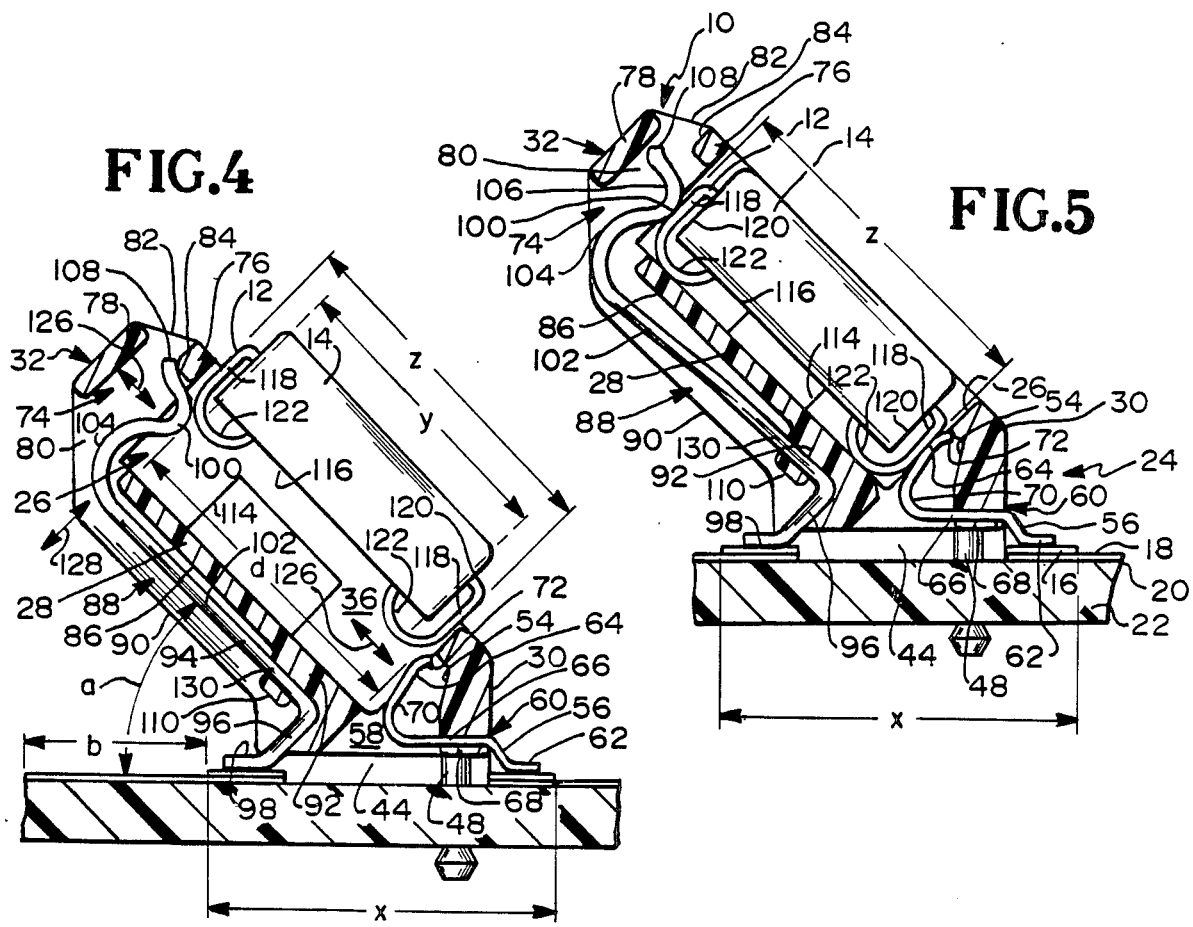
FIG.4
FIG.5

HEAT-DISSIPATING SOCKET CONNECTOR FOR LEADED MODULES

BACKGROUND OF THE INVENTION

The present invention relates to a new and improved heat-dissipating socket connector for leaded modules. More particularly, it relates to a socket connector including a module-receiving recess which is angled up and off the surface of a printed circuit board and disposed at a heat dissipating angle, to provide a reliable electrical connector having reduced board space requirements.

Leaded modules, and small outline J-leaded devices (SOJs) are known. These J-leaded integrated circuit packages have traditionally been mounted flat on a printed circuit board and soldered at the curved end of the J lead to conductive pads on the printed circuit board. These SOJ devices have been used, for example, to increase memory of an electronic device and for other purposes. Although J-leaded devices of this type are intended for prolonged use, problems do arise from time to time with directly mounted and soldered-on devices.

In use, these devices can generate very high ambient temperatures, particularly at their metallic lead portions. These high ambient temperatures can lead to solder joint failure of some or all of the J-leads, which are difficult to visually inspect with a flat mounted SOJ package device. In addition, the development of very high ambient temperatures in use may be associated with a reduction in the electrical reliability of the leaded module itself. Moreover, the development of high temperatures in use may also adversely affect the electrical performance of other electrical components mounted in the same housing of an electronic device.

Some of these disadvantages have lead to the development of leaded module socket connectors which generally include a dielectric frame or housing including a plurality of metallic terminals which are adapted to engage the module leads. Illustrative examples of prior art socket connectors for leaded modules include U.S. Pat. No. 4,511,201; U.S. Pat. No. 4,558,397; WO No. 84/01859; and U.S. Pat. No. 4,645,279.

Each of the above-mentioned patents describe socket connectors including a dielectric frame member mounted in a coplanar manner with the surface of a printed circuit board. Terminals are disposed within the frame in order to make high pressure contact with the leads of an integrated circuit device. These board mounted sockets are intended to provide a mounting arrangement for a leaded module which is relatively more permanent than the module itself in use.

One major shortcoming associated with each of these coplanar socket arrangements is that the connector frame requires a larger amount of board surface area than would be required for mounting a J-leaded device directly to circuit elements on the base printed circuit board. Secondly, the coplanar mounting arrangement does not provide for heat dissipation to relieve the thermal stresses brought on by the high temperatures generated by the leaded devices in use. These prior arrangements permit very high ambient temperatures to be developed at the under side of the leaded device, between the upper surface of the printed circuit board and the device. The high temperatures in turn generate thermal stresses within the dielectric frame material which can result in warpage of the frame and misalignment for the terminals mounted in the frame.

Another major shortcoming provided by the above-mentioned coplanar socket connectors is that the solder connections between the socket terminals and the base printed circuit board are generally obscured by this arrangement. In the event of a failure of one or several of the solder joints or terminals, the entire device must be removed to identify the cause of electrical failure or intermittency. The result is that repair and and maintenance are extremely costly and this is a very serious shortcoming of prior art leaded module socket devices.

SUMMARY OF THE INVENTION

In order to overcome many of the disadvantages of the prior art leaded module socket connectors, it is an object of the present invention to provide a heat dissipating socket for a J-leaded package which does not require more board surface area than would be required for the J-leaded device alone, which permits ready visual inspection of the solder joint connections with the base printed circuit board to which the socket is attached; and which lifts the J-leaded device up into the air stream for improved heat dissipation and improved electrical reliability.

In accordance with these and other objects, the present invention provides a socket for connecting a leaded module to printed circuitry on a substrate. The socket is of the type including a unitary dielectric frame including a module-receiving recess defined by a bottom wall and first and second upstanding sidewalls. A first plurality of spaced terminals is disposed in the first sidewall, each terminal having one end adapted to contact a printed circuit on the substrate and a resilient contact portion at the other end extending into the recess adapted to contact a module lead. A second plurality of spaced terminals are disposed in the second sidewall. Each of these second terminals has a first end portion for contacting a printed circuit on the substrate and a resilient contact portion extending into the recess adapted to contact a module lead. The improvement in accordance the present invention comprises: providing a frame which is mounted cantedly with respect to the substrate so that the first sidewall lies adjacent thereto and the second sidewall is elevated from the substrate; and each terminal of the second plurality of the terminals includes a elongated beam portion joining the first end portion and the resilient contact portion with said beam portion extending along the outside surface of the bottom wall of the frame, whereby the new and improved socket is mounted up and off the substrate allowing for ventilation between the substrate and the bottom of the socket.

The socket connector of the present invention is designed to utilize the footprint of an unsocketed J-leaded package. The angled configuration of the socket of this invention retains the original printed circuit board area requirements, while still allowing for full visual inspection of the solder joints between socket terminals and circuits. By virtue of the angled mounting the socket connectors can be stacked and/or other components can be mounted under the overhanging sections. The overall result is that a new and improved socket of the present invention requires reduced board area occupancy as compared to coplanar mounted socket arrangements.

The new and improved cantedly mounted J-leaded connector of this invention provides for natural or unforced convection from an inclined plane, which is more effective than from a horizontal surface, as is provided in prior art socket arrangements. The socket connector of the present invention gets the package up into the air stream which effectively reduces high temperature induced failures. Heat-dissipating advantages may be further improved by locating the cantedly mounted socket device of this invention in a forced convection housing.

The new and improved heat dissipating socket design of the present invention is made possible by the provision of unique contact structure including stiff and flexible terminal members. The terminals of the present socket connector are adapted to electrically engage the side portions of a J-lead or contact, as opposed to the bottom side of the J-lead. Manufacturers of J-leaded devices carefully control the bottom portions of the J-leads for coplanarity, however, the side portions of the J-leads may include very large manufacturing tolerances which must be accommodated.

In miniaturized closely spaced leaded devices for example, wherein the centerline spacing between adjacent J-leads is on the order of 0.050 inch, control of terminal position within the socket is very important. Moreover, the terminals must be mounted in such manner that, on the one hand, the required high contact forces are generated, generally on the order of greater than 250 grams for tin systems. On the otherhand, module manufacturing tolerances require that the terminals be adapted to cope with very large deflections. The design requirements dictate that very high efficiency beams must be included which provide increased deflection over the desired contact pressure range to accommodate tolerances in the J-lead, without loading the plastic frame member to an undesireable extreme.

In accordance with this aspect of the invention, an improved terminal configuration is provided which includes a long, highly efficient, flexible beam which engages the elevated leads within the socket. The elongate terminal is specially configured to provide a constant moment over the beam section, which provides a highly efficient beam. This terminal configuration enables the size of the socket to be kept at a minimum, while producing the required high contact forces throughout a modular package's tolerance range.

In preferred embodiments, the heat dissipating socket connector is additionally provided with opposed end walls defining the modular receiving recess, including tool receiving notches to permit easy access of a tool for extracting the packages. In addition, the housing is provided with mounting projections which are received within complementary apertures within the printed circuit substrate, to accommodate any torquing developed during insertion or removal of the J-leaded device, to alleviate or reduce overstressing of solder connections between the socket terminals and printed circuitry on the base printed circuit board.

Other objects and advantages of the present invention will become apparent from the following detailed description, taken in conjunction with the drawings in which:

BRIEF DESCRIPTION OF THE DRAWINGS

FIG. 1 is an exploded perspective view of the new and improved socket connector of the present invention adapted to be mounted on the printed circuit substrate and to receive a J-leaded module.

FIG. 2 is an elevated cross sectional view of the new and improved socket connector of the present invention mounted on a printed circuit substrate.

FIG. 3 is a top plan view of the new and improved heat dissipating socket connector of the present invention;

FIG. 4 is an elevated cross sectional view of the new and improved heat dissipating socket of the present invention shown at the beginning stages of insertion of the J-leaded module;

FIG. 5 is an elevated cross sectional view of a J-leaded module fully installed in the new and improved heat dissipating socket of the present invention;

FIG. 6 is a perspective view of the new and improved heat dissipating socket of the present invention shown in use mounted on a printed circuit board with a fully installed J-leaded module therein;

DETAILED DESCRIPTION OF THE PREFERRED EMBODIMENT

Figure 7:
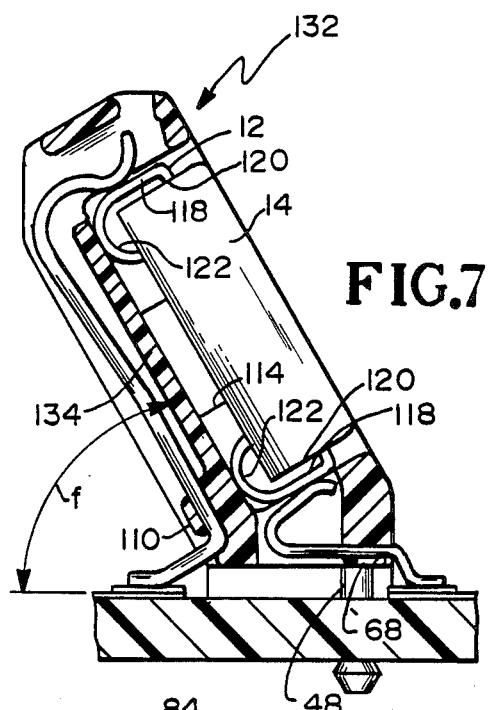
FIG. 7 is an elevated cross sectional view of an alternate embodiment of the new and improved heat dissipating socket of the present invention wherein the module receiving recess is disposed at a 60 degree angle with respect to the printed circuit substrate.

Referring now to FIGS. 1–3, a preferred embodiment of the new and improved heat-dissipating socket for leaded modules, generally referred by reference numeral 10, is shown. Socket connector 10 is intended for connecting individual leads or terminals 12 of a leaded module, such as a J-leaded module 14, to individual contact pads 16 associated or aligned with individual circuits 18 disposed on a major surface 20 of a printed circuit board or substrate 22.

Socket 10 includes a unitary dielectric molded frame 24 including a module-receiving recess 26 of generally rectangular configuration defined by a bottom wall 28, a pair of opposed upstanding sidewalls 30 and 32 and a pair of opposed upstanding endwalls 34, 36.

Depending from the lower portions of endwalls 34 and 36 adjacent lower sidewall 30 are base or mounting support portions 38 and 40, respectively. Each base support portion 38 and 40 includes a downwardly extending board stand-off projection 42 and 44 and a depending mounting projection 46 and 48, respectively. Mounting projections 46 and 48 are adapted to be press-fit into mounting apertures 50 and 52, respectively, provided in printed circuit board 22 to retain socket connector 10 on circuit board 22, in a well known manner. Mounting projections 46 and 48 are also provided to accommodate any torque related stresses introduced into the mounted socket arrangement 10 during insertion or removal of a leaded module 14 from recess 26.

As shown in FIGS. 2–6, when the frame 24 of the preferred embodiment is mounted onto printed circuit substrate 22, with mounting projections 46 and 48 press-fit into mounting apertures 50 and 52, respectively, sidewall 30 lies adjacent substrate surface 20. Bottom wall 28 of module-receiving recess 26 is canted at a heat-dissipating angle, a, with respect to upper surface 20, so that sidewall 32 is elevated up and off surface 20 of printed circuit board 22. In the preferred embodiment shown in FIGS. 1–6, heat-dissipating angle, a, is approximately 45 degrees.

Sidewall 30 includes a plurality of terminal-receiving cavities 54 adapted to receive a corresponding plurality of first, relatively stiff, stamped metallic terminals 56. Terminal-receiving cavities 54 define a number of partition projections 58 in sidewall 30. Cavities 54 and partitions 58 effectively define a scalloped bottom portion 60 in sidewall 30.

Each terminal 56 includes a first end 62 adapted to electrically engage a printed circuit 18 on printed circuit board 22, a resilient contact portion 64 at the opposed end extending into module-receiving recess 26 adapted to electrically engage a lead 12 on lead module 14, and an intermediate mounting portion 66 extending therebetween. In the preferred embodiment shown in FIGS. 1–6, first ends 62 of terminals 56 include a surface mount contact configuration for making solder connections to contact pads 16 aligned with each circuit 18 of printed circuit substrate 22.

Each terminal 56 is preferably fixedly mounted to sidewall 30 by heat-staking or ultrasonic staking at scalloped base portion 60. In this connection, a portion of the partitions 58 along bottom portion 60 can be deformed over mounting portions 66 of terminals 56 loaded into cavities 54 to form a retaining bead 68 by heat or ultrasonic staking methods well known to those skilled in this art. Although heat-staking methods are prefered, other known terminal mounting methods, such as providing a mounting barb on the terminal mounting portion 66 adapted for press-fit engagement of terminals 56 into cavities 54 at base portion 60, may also be employed.

Lead contact portions 64 of terminals 56 are provided on a relatively stiff, resilient deflectable spring arm 70 terminating in a free end 72, which is angled relative to mounting portion 66. Lead contact portions 64 extend into module-receiving recess 26 as shown in FIGS. 2–3 so that contact portions 64 are positioned to resiliently engage side portions of J-leads 12 when module 14 is inserted into recess 26.

Opposed sidewall 32 is also provided with a plurality of ventilating terminal-receiving cavities 74 which effectively define a terminal retention rib 76, an anti-overstress rib 78 and plurality of partitions 80 in sidewall 32. Angled upper surface 82 of sidewall 32 is provided with a plurality of ventilating windows or openings 84, each window 84 communicating with a terminal cavity 74 for ventilation. The underside 86 of sidewall 32 is also open for ventilation and air flow.

Bottom wall 28 defines the bottom surface of module receiving recess 26. The underside of bottom wall 28 opposite recess 26 is provided with a plurality of terminal receiving grooves or recesses 88, also defining a plurality of partitions 90, which form extensions of partitions 80 in sidewall 32. Bottom wall 28 also includes an L-shaped mounting portion 92 extending opposite recess 26.

A second plurality of high efficiency resiliently deflectable stamped terminals 94 are mounted to frame 24. More particularly, terminals 94 include a first end 96 including a surface mount contact portion 98 adapted to electrically engage a contact pad 16 on circuit board 22, a lead contact portion 100 at the opposed end and an elongate beam portion 102 extending therebetween. First end 96 extends perpendicularly from beam portion 102 in a direction opposite or away from recess 26.

Lead contact portion 100 extends generally perpendicularly from beam portion 102 toward recess 26 and includes a curved configuration including an inward bend at 104, a reverse bend at 106 and another slight inward bend at free end 108. The inward and outward bends at 104 and 106 provide the lead contact portion 100 which extends into modular receiving recess 26 adapted to engage a side portion of a J-lead 12 of an inserted module 14.

As shown in FIG. 2, terminals 94 are mounted to frame 24 so that elongate beam portion 102 extends adjacent bottom wall 28 opposite recess 26 within a terminal receiving groove 88. Lead contact portion 100 extends into a terminal receiving cavity 74 in sidewall 32 with the slightly curved free end 108 engaged and preloaded against terminal retention rib 76. Terminals 94 are fixedly mounted adjacent their first ends 96 by heat-staked retention bead 110 formed between adjacent partitions 90 in mounting portion 92.

Frame 24 also preferably includes opposed upstanding end walls 34 and 36 connecting sidewalls 30 and 32. As shown in FIGS. 1–3, endwalls 34 and 36 each include a ramped tool-guiding recess portion 112 opposite module receiving recess 26 having a tool receiving aperture or opening 114 extending therethrough. Tool-receiving openings 114 are provided to permit insertion of the opposed ends of preferrably C-shaped tool through endwalls 34 and 36 into the lower portion of module-receiving recess 26. Openings 114 permit a tool to be inserted adjacent bottom wall 28 and to engage the underside surface 116, of an installed leaded module 14, from both sides or either side, without contacting or damaging the individual leads 12, in order to pop or lift module 14 out of module-receiving recess 26.

In accordance with the present invention, the new and improved socket connector 10 may be prepared by precision molding dielectric frame 24 as an integral, unitary dielectric molding. The design requirements dictate that frame 24 be molded from dielectric thermoplastic materials exhibiting high temperature resistance, high modulus and good dimensional stability properties. Illustrative examples of suitable dielectric thermoplastics are poly(phenyl sulfones), poly(phenol sulfides) and liquid crystal polymers. More conventional thermoplastic polyester dielectric molding materials are generally not well suited for the present application because they generally do not exhibit sufficient dimensional stability in the face of repeated thermal excursions and prolonged exposure to high temperatures, which will be encountered by frames 24 in use.

Both sets of terminals 56 and 94 are preferably stamped and formed from conductive metallic sheet stock exhibiting high electrical and thermal conductivity. The socket terminals 56 and 94 are designed to provide a tin contact system capable of generating resilient contact forces of contact portions 64 and 100 on the J-leads 12 of generally greater than 250 grams. Terminals 56 and 94 are preferably formed from tin-plated, non-nickel copper based stock and especially preferrably from beryllium-copper stock. The gauge of the sheet metal stock for terminals 56 and 94 may be the same or different and is selected to provide the necessary resiliency and spring characteristics to the finally formed terminals. The terminals may be stamped and formed together with a carrier strip and mass inserted into the terminal receiving cavities of dielectric frame 24, in accordance with well known methods. In a concurrent operation, the terminals may be heat staked or ultrasonically welded to the mounting portions of the dielectric frame 24.

The operation and use of the new and improved socket connector 10 is illustrated in FIGS. 4–6.

Referring to FIG. 4, the pre-loaded frame 24 including mounted and heat-staked terminals 56 and 94 is mounted onto printed circuit board 22 by press-fit insertion of mounting pegs 46 and 48 into board mounting apertures 50 and 52, shown in FIG. 1, until board stand-off projections 42 and 44 come to rest on upper board surface 20. In this mounted position, surface mount contact portions 62 and 98 will each engage an aligned one of contact pads 16, associated with printed circuits 18. The mounted board/connector subassembly is then subjected to reflow soldering conditions known to those skilled in this art to electrically connect contact portions 62 and 98 to circuits 18. As shown in FIG. 4, the distance, x, between opposed and aligned contact pads 16 on circuit board 22 is generally the same as the contact pad spacing required for placement of a prior art unsocketed module wherein the J-leads are directly soldered to printed circuit contact pads. The distance x may be greater than, less than or equal to the distance, y, defined between the curved portions 122 of an opposing aligned pair of J-leads 12 on module 14. The surface area occupancy requirements for the new and improved socket connector 10 is equal or less than the board surface area required for unsocketed, directly soldered J-leaded modules, mounted in the coplanar prior art manner.

Each solder connection between contact portions 62 and 98 and contact pads 16 for socket connector 10 are fully visually inspectable and are not obscured by frame 24. Computerized visual inspection is also possible in accordance with this arrangement. This visibility feature provides distinct advantages for socket connector 10. Quality control testing after reflow operations is easier. If one circuit of the connector tests defective, the solder joint for that associated terminal can be inspected and manually re-soldered to correct the problem, without having to remove the entire connector, which is in time-consuming, costly and wasteful. If a failure occurs after extended use, visual inspection and correction are also facilitated by this arrangement.

In accordance with the present invention, the mounted connector 10 is cantedly mounted with respect to upper board surface 20, with sidewall 32 elevated up and off surface 20 and with bottom wall 28 disposed at a 45 degree heat-dissipating angle with respect to upper surface 20. In addition, to the advantageously low board surface area requirements for surface mount contact portions 62 and 98, the canted mounting of frame 24 causes a major portion of socket connector 10 to elevatedly overhang a portion of board surface 20.

More particularly, the canted mounting of socket connector 10 provides a board surface area, b, to the left of contact portion 98 and under bottom wall 28 and sidewall 32 with sufficient vertical clearance to permit additional circuit components to be mounted onto surface 20 in high density end use applications. Moreover, several socket connectors 10 can be adjacently stacked in a relatively closely-spaced manner on board surface 20, so that adjacent frame portions do not interfere with insertion removal access to module-receiving recess 26, to provide a printed circuit board 22 having dramatically expanded memory or other capabilities which may be used as a component in a computer or other electronic device.

Referring now to FIGS. 4–5, socket 10 is designed to provide reliable electrical connections between individual leads 12 of module or package 14 and circuits 18 on printed circuit board 22, by providing an efficient terminal arrangement which effectively permits a greater amount of terminal deflection over a desired contact pressure range. The terminal arrangement is designed to accommodate variations in the position of side portions 118 of individual J-leads 12 relative to the sides 120 of module body 14, which in turn cause variations in the apparent width, Z, of the module 14 presented to lead contact portions 64 and 100 within recess 26. As has been mentioned, J-leaded module manufacturers carefully control the bottom curved portions of J-leads 12 for coplanarity, however, large manufacturing tolerances are allowed with respect to position of side portions 118.

The beginning stage of insertion of J-leaded module 14 into module receiving recess 26 is shown in FIG. 4. Terminals 56 and 94 are mounted to frame 24 so that their respective lead contact portions 64 and 100 extend into recess 26. Terminals 56 and 94 are mounted so that the separation distance, d, between each opposed and aligned pair of lead contact portions 64 and 100 is less than the calculated minimum apparent width Z of aligned J-leads on module 14, considering maximum manufacturing tolerances for module 14. Contact portions 64 and 100 are therefore positioned in recess 26 to engage J-leads 12 at the lower portions of sides 118 adjacent curved portions 122 as shown in FIG. 4.

As shown now in FIG. 5, upon further insertion of module 14 into recess 26, lead contact portions 64 and 100 will slidingly engage the side portions 118 of J-leads 12. Module 14 is fully inserted in recess 26 when curved portions 122 of J-leads 12 abut bottom wall 28. In the process, contact portions 64 and spring arms 70 of terminals 56 will be deflected inwardly within sidewall 30 in the direction of arrow 124. Simultaneously, lead contact portions 100 of terminals 94 and elongate beam portions 102 are deflected outwardly and downwardly so that free end 108 is moved out of engagement with terminal retention rib 76 toward anti-overstress rib 78 and beam portion 102 is deflected away from bottom wall 28. The configuration of terminal 94 with its long beam portion 102 is specially designed to cope with large deflections which may be encountered during insertion of module 14 to include the maximum calculated apparent width Z possible given module manufacturing tolerances.

Elongate terminal 94 permits recess 26 to be canted off of the surface 20. The double-bend configuration of contact portion 100 is resilient in the direction of arrow 126. The attached elongate beam portion 102 is resiliently deflectable in the direction of arrow 128 and effectively pivots about point 130 disposed adjacent bead 110 and mounting portion 92 of bottom wall 28. These resilient deflectable properties of elongate terminals 94 and terminals 56 may accommodate the full range of manufacturing tolerances for the J-leaded modules as long as the contact separation distance, d, is less than the apparent width, Z, of opposing leads 12 on either side of module 14. Sufficient contact pressures between respective contact portions 64 and 100 and side portions 118 on leads 12 is provided over the full contemplated deflection range without overstressing terminals 56 or 94.

As has been mentioned above, any torquing or other stresses developed during insertion or removal of leaded module 14 into recess 26 are generally transmitted through frame 24 to mounting pegs 46 and 48 to circuit board 22, instead of being transmitted by the terminals 56, 94 to surface mount contact portions 62 and 98. This arrangement provides some stress isolation for the solder joints between contact portions 62 and 98 and contact pads 16 to further improve electrical reliability in use. In addition, the underside heat staked mounting of terminals 56 and 94 to frame 24 at an intermediate section of the terminals, provides a terminal mounting arrangement which does not undesireably load the thermoplastic frame during insertion/withdrawal deflections of the terminals or after repeated thermal excursions experienced by the assembled connector 10 in use.

The design of frame 24, together with the high temperature resistance thermoplastic materials used to mold it, combine to provide a substantially warp resistant housing in use. The underside heat staked mounting of terminals 56 and 94 together with the precision-molded and dimensionally stable terminal receiving structures 54, 58, 74, 76, 80, 88 and 90 comprising cavities, ribs, partitions and grooves in frame 24 provide positive position assurance for contact portions 64 and 100 within recess 26 for enhanced pitch control and centerline to centerline mating of contact portions 64 and 100 to side portions 118 of leads 12, even in low pitch, high density embodiments of connector 10 in use.

The new and improved socket connector 10 of this invention further provides enhanced reliability by providing a number of heat dissipating features. As shown in FIGS. 5-6, dielectric frame 24 includes a plurality of substantially open terminal receiving cavities 54 and 74, which are generally open along the underside of the frame 24. Cavities 74 in sidewall 32 include windows 84 which effectively permit ventilating air flow through sidewall 32 from lower surface 86 through to top surface 82 as well as through sidewall 32 up and out of recess 26.

Elongate terminals 94 are mounted for ventilated exposure to airflow along the back side of bottom wall 28 as well. Terminals 94 are thermally conductive, and heat or high temperatures developed between J-leads 12 and contact portions 100 in use can be effectively radiated and dissipated over the exposed length of terminal 94. This heat-dissipating arrangement substantially reduces the possibility of heating surface mount contact portions 62 and 98 to temperatures high enough to compromise the electrical integrity of the solder connections with contact pads 16 and circuits 18. The canted mounting of an installed module 14 permits heat dissipation from the upper surface of the module 14 to be from an inclined surface which is more efficient than from a coplanarly mounted unsocketed J-lead module presenting a horizontal upper surface for heat dissipation.

Furthermore, when module 10 is used in a high density arrangement with a number of other board mounted components, as well as in modern three-dimensional circuit boards, indirect heating from these adjacent circuit elements through the board elements and upwardly via the terminals to the module may occur. In accordance with this invention, undesirable heat may be dissipated in this upward direction as well along the exposed terminal 94.

Figure 8:
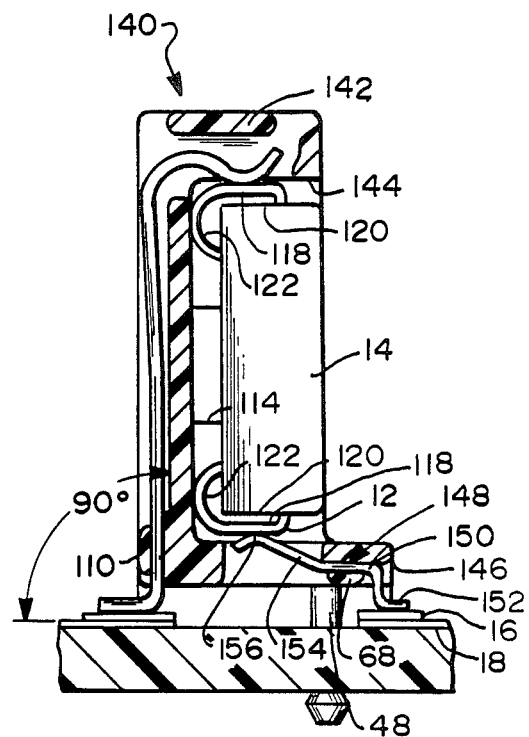
FIG. 8 is an elevated cross sectional view of an alternate embodiment of the new and improved heat dissipating socket of the present invention including a module receiving recess disposed at a 90 degree angle with respect to the printed circuit substrate.
Figure 9:
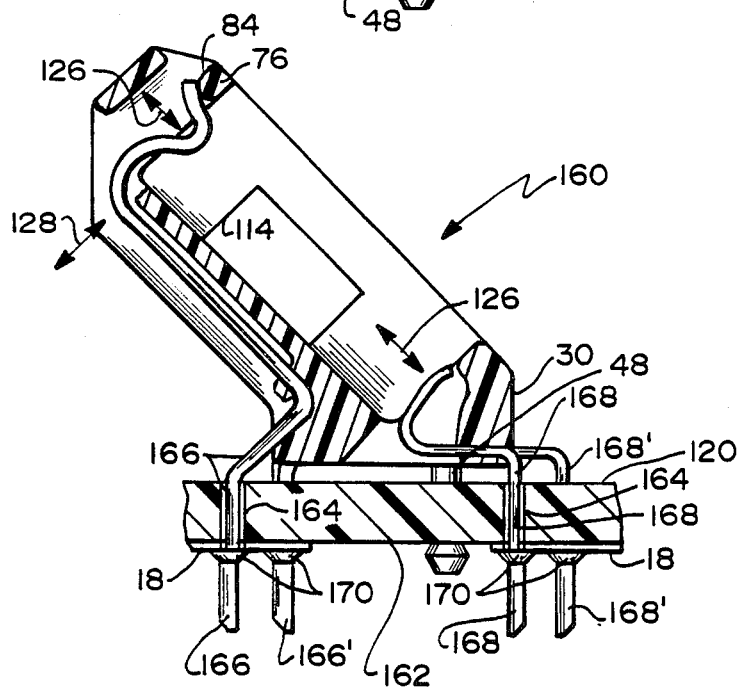
FIG. 9 is an elevated cross sectional view of an alternate embodiment of the new and improved heat dissipating socket shown in FIG. 2 including a terminal configuration having solder tails for making through-hole connections to circuitry on the printed circuit substrate.

Referring now to FIGS. 7-9, several alternate embodiments of the new and improved heat dissipating socket connector of the present invention are shown.

More particularly, FIG. 7 shows an alternate socket connector 132 mounted on circuit board 22 having a fully installed J-leaded module inserted into a module receiving recess 26 including a bottom wall 134 which is canted at an angle f, which is 60 degrees relative to surface 20 of circuit board 22. Socket connector 132 is substantially the same in all other respects to preferred socket connector 10. The 60 degree canted socket design for connector 134 provides additional vertical clearance between the overhanging portions of socket 132 and surface 20.

In FIG. 8, still another socket connector 140 is shown including a dielectric frame 142 defining a module receiving recess 144 which is canted at an angle of 90 degrees with respect to surface 20. Modified frame 142 includes a generally rectangular sidewall 30 including forwardly projecting portion 146 extending adjacent board surface 20. A modified short terminal 148 is mounted to sidewall 30 including an intermediate mounting portion 150 heat staked to sidewall 30, a surface mount contact portion 152 at one end adapted to engage a contact pad 16 and a cantilever spring arm 154 extending from the opposed end terminating in a curved lead contact portion 156. Lead contact portions 156 extend upwardly through terminal receiving cavities 54 into module receiving recess 146. In accordance with this embodiment, a J-leaded module 14 is inserted into recess 146 from the right as shown in FIG. 8.

FIG. 9 shows an alternate 45 degree socket connector 160, substantially the same as connector 10 shown in FIGS. 1-6, with the exception that circuits 18 are defined at the underside surface 162 of printed circuit board 22. Circuit board 22 is additionally provided with a staggered footprint array of throughhole apertures 164, one aligned with each circuit 18. Terminals 56 and 94 have been modified so that instead of having surface mount contact portions 62 and 98, respectively, they now include soldertails 166 and 168 extending completely through apertures 164 and electrically engaged to circuits 18 by means of solder joints 170 formed therebetween in a wave soldering operation. As shown in FIG. 9, adjacent terminals 56 and 94 are provided with soldertail portions 166, 166' and 168, 168' respectively which are of different lengths to permit adjacent soldertails on adjacent terminals to be formed in a staggered manner to mate with the staggered footprint array of apertures 164 provided in circuit board 22. Any of these modifications or changes required to convert surface mount socket connector 10 into a soldertail socket connector 160 will be readily apparent to those skilled in this art.

In accordance with the present invention, a new and improved heat-dissipating socket connector for connecting individual leads of a leaded module to individual circuits on a printed circuit board is provided. The socket connector includes a module receiving recess defined within a frame which is angled with respect to the printed circuit board surface. Compliant terminals are mounted in generally open terminal receiving cavities within the frame which are adapted to engage side portions of leads on an inserted module with high contact pressure in an anti-overstress manner. Openings within the frame together with an exposed terminal mounting arrangement, provide ventilation and airflow exposure for portions of the connector and module susceptible to the generation of high temperatures in use. The overall arrangement provides enhanced electrical reliability by reducing the possibility of heat induced failures. The new and improved socket connector does not require increased board surface area and provides for full visual inspection for solder connections between connector terminals and printed circuits.

Although the present invention has been described with reference to certain preferred embodiments, it is apparent that modifications or changes may be made therein by those skilled in this art without departing from the scope and spirit of this invention as defined in the appended claims.

We claim:

1. In a socket connector for connecting a leaded module to printed circuitry on a substrate, said socket including a unitary dielectric frame including a module-receiving recess defined by a bottom wall and first and second opposed upstanding sidewalls, said frame being mounted on a surface of said substrate, a first plurality of spaced terminals disposed in said first sidewall, each having a first end adapted to contact a printed circuit on the substrate and a resilient contact portion extending into said recess adapted to contact a module lead, and a second plurality of spaced terminals disposed in said second sidewall, each having a first end portion for contacting a printed circuit on the substrate and a resilient contact portion extending into the recess adapted to contact a module lead, the improvement comprising:

said frame being mounted cantedly with respect to the substrate so that the first sidewall lies adjacent thereto and the second sidewall is elevated from the substrate;

each terminal of said second plurality of terminals having an elongate beam portion joining the first end portion and the resilient contact portion and extending along the outside surface of the bottom wall of the frame;

whereby, said socket is mounted up and and off the substrate allowing for ventilation between the substrate and the bottom of the socket.

2. A socket connector as defined in claim 1, wherein the bottom wall is disposed at a heat-dissipating angle with respect to the substrate surface.

3. A socket connector as defined in claim 2 wherein said heat dissipating angle is approximately 45 degrees.

4. A socket connector as defined in claim 2, wherein said heat dissipating angle is approximately 60 degrees.

5. A socket connector as defined in claim 2, wherein said heat dissipating angle is approximately 90 degrees.

6. A socket connector as defined in claim 1, wherein said first sidewall includes a plurality of terminal-receiving cavities, each pair of adjacent cavities being separated by a partition, said first sidewall cavities and partitions defining a scalloped bottom surface in said first sidewall including a plurality of open terminal receiving grooves.

7. A socket connector as defined in claim 6, wherein said second sidewall includes a plurality of open terminal-receiving cavities, each pair of adjacent cavities being separated by a partition, said second sidewall further including a terminal retention rib and an anti-overstress rib extending along the length of said second sidewall.

8. A socket connector as defined in claim 7 wherein said outside surface of the bottom wall includes a plurality of upstanding partitions extending the length thereof forming extensions of the partitions in the second sidewall and defining a corresponding plurality of terminal-receiving grooves along said outer surface.

9. A socket connector as defined in claim 8 wherein said frame further comprises depending mounting means including a mounting projection disposed adjacent opposed ends of said first sidewall and said bottom wall.

10. A socket connector as defined in claim 9 wherein the elongate beam portions of said second terminals are each disposed in a terminal-receiving groove in said outside surface, said first end portion extending generally perpendicularly from the beam portion opposite said recess and said resilient contact portions extending generally perpendicularly from said beam portion toward said recess and into said second sidewall cavities.

11. A socket connector as defined in claim 10 wherein said second terminals are staked into said terminal receiving grooves at a point on said beam portion adjacent said first end, thereby mounting said terminals to said frame and defining a deflection pivot point for said elongate beam portion.

12. A socket connector as defined in claim 11, wherein said resilient contact portions of said second terminals have a double bend configuration terminating in a curved free end which is preloaded and abuts against said contact retention rib in said second sidewall.

13. A socket connector as in claim 12, wherein said resilient contact portions of said second terminals are resiliently deflectable in a direction generally parallel to said beam portion, and said beam portion is resiliently deflectable about said pivot point in a direction generally parallel to said resilient contact portion.

14. A socket connector as in claim 13 wherein said first plurality of terminals each include a mounting portion extending between said first end portion and said resilient contact portion, said mounting portions being staked into said grooves in the first sidewall.

15. A socket connector as in claim 1 wherein said frame further includes a pair of opposed upstanding endwalls connecting said bottom wall and opposed ends of said first and second sidewalls, respectively, to define a generally rectangular module-receiving recess.

16. A socket connector as in claim 15 wherein said endwalls each include tool receiving means providing access to said recess for an extraction tool.

17. A socket connector as in claim 1 wherein said module-receiving recess is configured to receive a J-leaded module and the resilient contact portions of said first and second terminals extending into the recess are positioned to compliantly electrically engage side portions of the J-leads on the module.

18. A socket connector as in claim 1 wherein said frame comprises an dimensionally stable, high temperature, high module thermoplastic dielectric molded article.

19. A socket connector as in claim 18 wherein said thermoplastic is selected from poly(phenyl sulfones), poly(phenol sulfides) and liquid crystal polymers.

* * * * *